(12) United States Patent
Peng et al.

(10) Patent No.: US 12,020,937 B2
(45) Date of Patent: Jun. 25, 2024

(54) CARBON IMPLANTATION FOR THICKER GATE SILICIDE

(71) Applicant: GlobalFoundries U.S. Inc., Malta, NY (US)

(72) Inventors: Jianwei Peng, Clifton Park, NY (US); Hong Yu, Clifton Park, NY (US); Man Gu, Malta, NY (US); Eric S. Kozarsky, Gansevoort, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 115 days.

(21) Appl. No.: 17/701,759

(22) Filed: Mar. 23, 2022

(65) Prior Publication Data

US 2023/0307238 A1    Sep. 28, 2023

(51) Int. Cl.
| | |
|---|---|
| *H01L 21/28* | (2006.01) |
| *H01L 21/285* | (2006.01) |
| *H01L 21/3215* | (2006.01) |
| *H01L 21/84* | (2006.01) |
| *H01L 27/12* | (2006.01) |
| *H01L 29/45* | (2006.01) |
| *H01L 29/49* | (2006.01) |

(52) U.S. Cl.
CPC .. *H01L 21/28052* (2013.01); *H01L 21/28518* (2013.01); *H01L 21/32155* (2013.01); *H01L 21/84* (2013.01); *H01L 27/1203* (2013.01); *H01L 29/45* (2013.01); *H01L 29/4933* (2013.01)

(58) Field of Classification Search
CPC .......... H01L 21/28052; H01L 29/4933; H01L 29/45; H01L 21/28518; H01L 21/84; H01L 21/26506
USPC .................................. 257/199, 200; 438/199
See application file for complete search history.

(56) References Cited

U.S. PATENT DOCUMENTS

| | | |
|---|---|---|
| 6,180,469 B1 | 1/2001 | Pramanick et al. |
| 8,546,259 B2 | 10/2013 | DeLoach et al. |
| 8,642,434 B2 | 2/2014 | Liu et al. |
| 10,297,601 B2 | 5/2019 | Kim et al. |
| 10,629,443 B2 | 4/2020 | Anderson et al. |
| 10,825,740 B2 | 11/2020 | Adusumilli et al. |
| 2006/0121660 A1 | 6/2006 | Rhee et al. |
| 2007/0249131 A1 | 10/2007 | Allen et al. |
| 2013/0026582 A1 * | 1/2013 | Javorka et al. ... H01L 21/28052 257/413 |

OTHER PUBLICATIONS

European Search Report for corresponding EP Application No. 22205711.9 dated Jul. 27, 2023, 8 pages.

* cited by examiner

*Primary Examiner* — Karen Kusumakar
(74) *Attorney, Agent, or Firm* — Francois Pagette; Hoffman Warnick LLC

(57) ABSTRACT

Semiconductor structures include a channel region, a gate dielectric on the channel region, source and drain structures on opposite sides of the channel region, and a gate conductor between the source and drain structures on the gate dielectric. The source and drain structures include source and drain silicides. The gate conductor includes a gate conductor silicide. The gate conductor silicide is thicker than the source and drain silicides.

7 Claims, 5 Drawing Sheets

CARBON IMPLANTATION FOR THICKER GATE SILICIDE

BACKGROUND

Field of the Invention

The present invention relates to gates within transistors and more particularly to silicide gate conductors with reduced resistance.

Description of Related Art

Key factors considered in modern integrated circuit design include, but are not limited to, performance, power scaling, size scaling, and manufacturing efficiency. However, oftentimes improvement with respect to one of these factors can result in an undesirable trade-off with respect to one or more of the other factors. For example, techniques for reducing gate resistance of field effect transistors employed in high voltage (HV) switching and radio frequency (RF) applications can result in unwanted increases in area consumption and/or manufacturing complexity.

SUMMARY

In view of the foregoing, disclosed herein are structures that include a channel region, a gate dielectric on the channel region, source and drain structures on opposite sides of the channel region, and a gate conductor on the gate dielectric. The source and drain structures include source and drain silicides, respectively. The gate conductor includes a gate conductor silicide. The gate conductor silicide is thicker than the source and drain silicides.

In other embodiments, structures herein include a channel region, a gate dielectric on the channel region, source and drain structures on opposite sides of the channel region, and a gate conductor on the gate dielectric. The source and drain structures include source and drain silicides, respectively. The gate conductor includes a gate conductor silicide. The gate conductor silicide is thicker than the source and drain silicides. The gate conductor has a higher carbon concentration than the source and drain structures.

Methods herein form a channel region, form a gate dielectric on the channel region, form a gate conductor on the gate dielectric, form source and drain structures on opposite sides of the channel region, form source and drain silicides on the source and drain structures, respectively, and form a gate conductor silicide on the gate conductor. The gate conductor silicide is formed thicker than the source and drain silicides.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, techniques for reducing gate resistance of field effect transistors employed in high voltage (HV) switching and radio frequency (RF) applications can result in unwanted increases in area consumption and/or manufacturing complexity.

In view of the foregoing, disclosed herein are integrated circuit (IC) transistor structures that use semiconductor devices such as field effect transistors (FET). A FET can include a channel, a gate dielectric on the channel region, source and drain structures positioned on opposite sides of the channel region, and a gate conductor on the gate dielectric. The source and drain structures include source and drain silicides, respectively, and the gate conductor includes a gate conductor silicide that is relatively thick as compared to the source and drain silicides such that the gate conductor has reduced gate resistance. With embodiments herein, the gate conductor has a higher silicide growth promoting-impurity concentration (e.g., a higher carbon concentration) than the source and drain conductors. This higher impurity concentration in the gate conductor can be, for example, a few to thousands of times higher than in the source and drain structures. In one example, the gate conductor has an amorphous silicon or polysilicon structure (containing a silicide growth promoting-impurity such as carbon) that is between the gate conductor silicide and the gate dielectric.

The greater concentration of the silicide growth promoting-impurity (e.g., carbon) in the gate conductor results in the gate conductor silicide being thicker than the source and drain silicides. For example, the gate conductor silicide can be at least 5%-45% thicker than the source and drain silicides. Further, the gate conductor silicide and the source and drain silicides can be the same metal silicide (e.g., nickel silicide (NiSi) or some other suitable metal silicide material) and can be formed simultaneously in the same silicide creation process.

Figure 1:
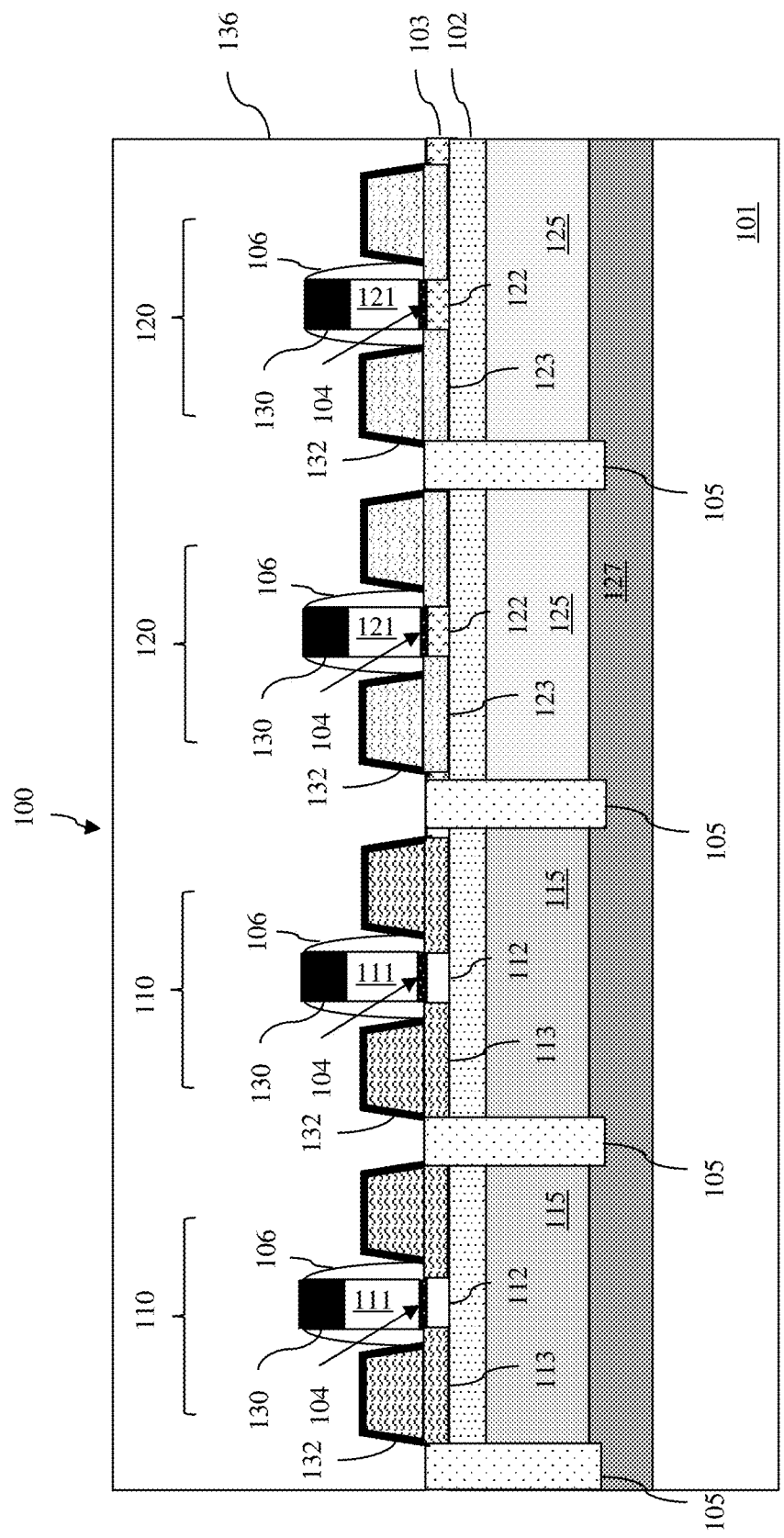
FIG. 1 is a cross-sectional schematic diagram of an integrated circuit structure according to embodiments herein.

More particularly, referring to FIG. 1, disclosed herein are embodiments of a semiconductor structure 100. The semiconductor structure 100 can include a semiconductor layer 103. In some embodiments, the semiconductor structure 100 can include a semiconductor substrate 101 (in which various well regions 115, 125, 127 are formed), an insulator layer 102 on the semiconductor substrate 101, and the semiconductor layer 103 on the insulator layer 102. In some embodiments, the semiconductor structure 100 can be a silicon-on-insulator (SOI) structure in which the semiconductor layer 103 is a silicon layer, the insulator layer 102 is a buried oxide (BOX) layer or some other suitable insulator layer, and the semiconductor substrate 101 is a silicon substrate. In some embodiments, this SOI structure can be an advanced SOI structure (e.g., a fully-depleted silicon-on-insulator (FDSOI) structure).

The semiconductor structure 100 can further include one or more field effect transistors (FETs) (e.g., see N-type FET (NFET) 110 and P-type FET (PFET) 120). These FETs can be regular threshold voltage (RVT) or high threshold voltage (HVT) n-type and p-type field effect transistors or super low threshold voltage (SLVT) or low threshold voltage (LVT) n-type and p-type field effect transistors. Optionally, the FET area can include a combination of both RVT or HVT n-type and p-type FETs and SLVT or LVT n-type and p-type FETs. Those skilled in the art will recognize that FETs with different threshold voltage levels (e.g., RVTs, HVTs, LVTs, SLVTs, etc.) will be configured differently. For example, such FETs will have differences in channel doping, halo implants, gate lengths and/or differences in any other parameter that alone or in combination with differences in other parameters can impact threshold voltage).

In any case, each NFET 110 can include, for example, an intrinsic (i.e., undoped) or P− channel region 112 in the semiconductor layer 103 extending laterally between N+ source and drain structures 113. Each N+ source and drain structure 113 can include, for example, a lower source and drain portion within the semiconductor layer 103 and, optionally, an upper source and drain portion (also referred to herein as a raised epitaxial source and drain portion) above the lower source and drain portion. Each NFET 110 can further include a gate conductor 111 on the channel region 112. Gate sidewalls spacers 106 can be positioned laterally adjacent to the sidewalls of the gate conductor 111 and can electrically isolate the gate conductor 111 from the source and drain structures 113. Each NFET 110 can further include a well region 115 in the semiconductor substrate 101 aligned below the channel region 112 and source and drain structures 113. For an RVT or HVT NFET, the well region 115 can be a P-well. For a SLVT or LVT NFET, the well region 115 can be an N-well.

As shown in FIG. 1, the source and drain silicides 132 reduces resistance of the source and drain structures 113 and similarly the gate conductor silicide 130 reduces resistance of the gate conductors 111. As noted above an increased concentration of a silicide growth promoting-impurity (such as carbon or some other suitable silicide growth promoting-impurity) in the gate conductor 111 results in the gate conductor silicide 130 being thicker than the source and drain silicides 132. For example, the gate conductor silicide 130 can be at least 5%-45% thicker than the source and drain silicides 132. Further, the gate conductor silicide 130 and the source and drain silicides 132 can be the same metal silicide (e.g., nickel silicide (NiSi) or some other suitable metal silicide) and can be formed simultaneously in the same silicide creation process.

Each PFET 120 can include an intrinsic (i.e., undoped) or N− channel region 122 in the semiconductor layer 103 extending laterally between P+ source and drain structures 123. Each P+ source and drain structure 123 can include, for example, a lower source and drain portion within the semiconductor layer 103 and, optionally, an upper source and drain portion (also referred to herein as a raised epitaxial source and drain portion) above the lower source and drain portion. Each PFET 120 can further include a gate conductor 121 on the channel region 122. Gate sidewalls spacers 106 can be positioned laterally adjacent to the sidewalls of the gate conductor 121 and can electrically isolate the gate conductor from the source and drain structures 123. Each PFET 120 can further include a well region 125 in the semiconductor substrate 101 aligned below the channel region 122 and source and drain structures 123. For a SLVT or LVT PFET, the well region 125 can be a P-well. For a RVT or HVT PFET, the well region 125 can be an N-well.

As shown in FIG. 1, the source and drain silicides 132 reduces resistance of the source and drain structures 123 and similarly the gate conductor silicide 130 reduces resistance of the gate conductors 121. As noted above an increased concentration of a silicide growth promoting-impurity (such as carbon or some other suitable silicide growth promoting-impurity) in the gate conductor 121 results in the gate conductor silicide 130 being thicker than the source and drain silicides 132. For example, the gate conductor silicide 130 can be at least 5%-45% thicker than the source and drain silicides 132. Further, the gate conductor silicide 130 and the source and drain silicides 132 can be the same metal silicide (e.g., nickel silicide (NiSi) or some other suitable metal silicide) and can be formed simultaneously in the same silicide creation process.

In each FET 110, 120, the source and drain structures 113, 123 and the gate conductors 111, 121 can be contacted (e.g., by conventional middle of the line (MOL) contacts through overlying insulating layer(s) 136). Optionally, the well region 115, 125 can also be contacted (e.g., by conventional middle of the line (MOL) contacts), thereby creating a FET 110, 120 with three primary terminals connected to the source and drain and gate, and a secondary terminal connected to the well regions. During FET operation, the secondary terminal can be selectively biased in addition to the primary terminals in order to modulate the threshold voltage (Vt) of the particular FET.

The semiconductor structure 100 can further include trench isolation regions 105. Each trench isolation region can include, for example, a trench, which extends vertically through the semiconductor layer 103 to the insulator layer 102, which, optionally, further extends through insulator layer 102 into the semiconductor substrate 101, and which is filled with one or more layers of isolation material (e.g., silicon dioxide or other suitable isolation material). Such trench isolation regions 105 can electrically isolate the different device areas from each other and can further electrically isolate different devices within those areas.

It should be understood that the description and drawings of the disclosed semiconductor structure embodiments are provided for illustration purposes and are not intended to be limiting. Additional embodiments of the semiconductor structure could include additional and/or alternative features not discussed above, could be devoid of features discussed above, and/or could be formed using some different processing technology platforms than the processing technology platforms discussed above.

Also, for example, the semiconductor structure 100 is described above and illustrated in the drawings as including only planar devices. That is, the FETs 110, 120 are all planar devices having gate conductors that are only adjacent to the top surface of the semiconductor layer 103. However, alternative semiconductor structure embodiments could include non-planar devices, such as fin-type devices (e.g., where the semiconductor layer is patterned, for example, in the shape of a semiconductor fin and the gate conductors are formed adjacent to the top surface and opposing sides of the semiconductor fin) or gate-all-around devices.

Finally, the semiconductor structure 100 is described above and illustrated in the drawings as being a semiconductor-on-insulator structure (e.g., a silicon-on-insulator (SOI) structure, such as a fully-depleted SOI (FDSOI structure). However, an alternative semiconductor structure embodiment could be a bulk semiconductor structure where the semiconductor layer discussed above refers to an upper portion of a bulk semiconductor substrate, such as a bulk silicon substrate (as opposed to a semiconductor layer on an insulator layer).

Also disclosed herein are embodiments of a method of forming a semiconductor structure such as the semiconductor structure 100, which is described in detail above, which is illustrated in FIG. 1, and which includes at least one field effect transistor (FET) (e.g., see the N-type FET (NFET) 110 and the P-type FET (PFET) 120).

More particularly, referring to FIGS. 2-7, the method embodiments can include providing a wafer. In some embodiments, the wafer can be a semiconductor-on-insulator wafer, which includes a semiconductor substrate 101, an insulator layer 102 on the semiconductor substrate 101, and a semiconductor layer 103 on the insulator layer. For example, the wafer could be a silicon-on-insulator (SOI) wafer, which includes a silicon substrate, a buried oxide (BOX) layer or some other suitable insulator layer on the silicon substrate, and a silicon layer on the BOX layer. In some embodiments, this SOI wafer can be an advanced SOI wafer (e.g., a fully-depleted silicon-on-insulator (FDSOI) wafer).

The method embodiments can include forming trench isolation regions 105 between and within different devices areas. For example, trenches can be formed (e.g., lithographically patterned and then etched) so that they extend essentially vertically through the semiconductor layer 103 and, optionally, through the insulator layer 102 and into the semiconductor substrate 101. The trenches can, for example, be patterned and etched so as to define the outer boundaries of the device areas and so as to further define the active regions of the FETs 110, 120 to be formed. Following trench formation, one or more layers of isolation material (e.g., silicon dioxide or some other suitable isolation material(s)) can be deposited so as to fill the trenches. Then, a polishing process (e.g., a chemical mechanical polishing (CMP) process) can be performed in order to remove the isolation material from the top surface of the semiconductor layer.

In addition to trench isolation region formation, various dopant implantation processes can be performed to form well regions 115, 125, 127. Specifically, one or more dopant implant processes can be performed in order to form a well region 115 in the semiconductor substrate 101 aligned below the NFET area (i.e., the area on which the NFET 110 is to be formed) a well region 125 in the semiconductor substrate 101 aligned below the PFET area (i.e., the area on which the PFET 120 is to be formed) and other well regions 127. The conductivity type of the well regions 115 and 125 will depend upon the threshold voltage types of the NFET 110 and PFET 120, respectively. For example, for an RVT or HVT NFET, the well region 115 can be a P-well, whereas, for an SLVT or LVT NFET, the well region 115 can be an N-well. For a SLVT or LVT PFET, the well region 125 can be a P-well, whereas, for a RVT or HVT PFET, the well region 125 can be an N-well. Thus, if the well regions 115, 125 require the same type conductivity, a single dopant implant process can be performed to concurrently form these well regions. If the well regions 115, 125 require different type conductivities, then the NFET area can be masked during the dopant implantation process to form the well region 125 and vice versa. Additional dopant implantation processes 127 can be performed in order to ensure that different portions of the semiconductor layer 103 for the FETs 110, 120 are appropriately doped.

Figure 2:
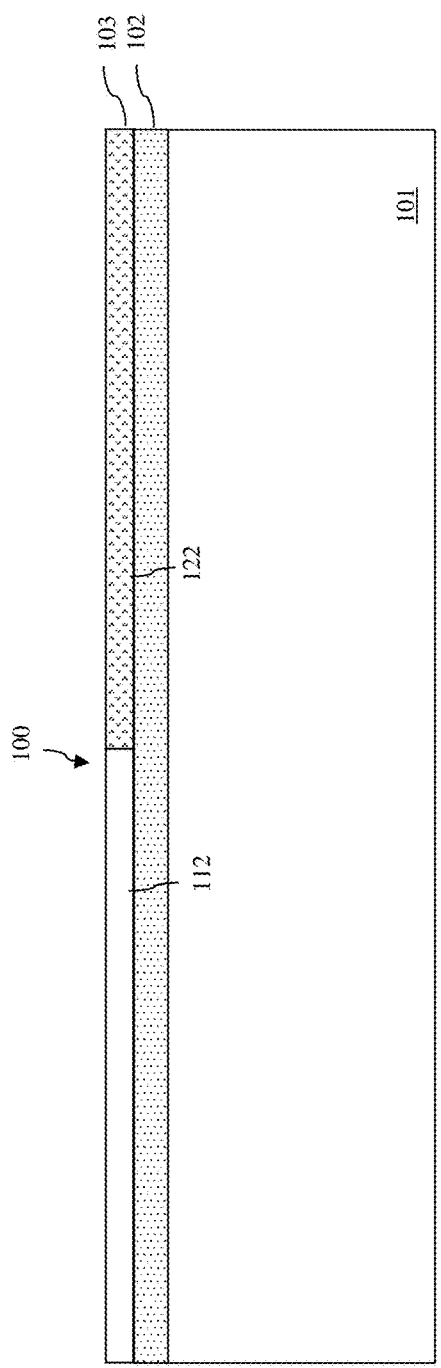
FIGS. 2-7 are a cross-sectional schematic diagrams of a partially completed integrated circuit structure according to embodiments herein.

Also, as discussed above with regard to the structure embodiments, the NFET 110 will have a channel region 112 and the PFET 120 will have a channel region 122. In some embodiments, the channel regions 112, 122 can remain undoped. However, in other embodiments, the channel region 112 of the NFET 110 can be doped so as to have P-type conductivity at a relative low conductivity level (i.e., so that the channel region 112 is a P-channel region) and the channel region 122 of the PFET 120 can be doped so as to have N-type conductivity at a relative low conductivity level (i.e., so that the channel region 122 is a N-channel region). FIG. 2 illustrates that differently doped channel regions 112, 122 can be formed on the buried oxide 102.

Techniques for performing masked dopant implantation processes to form deep well and other dopant implant regions with different conductivity types and different conductivity levels are well known in the art. Thus, the details of such dopant implantation processes have been omitted from this specification in order to allow the reader to focus on the salient aspects of the disclosed method embodiments.

Figure 3:
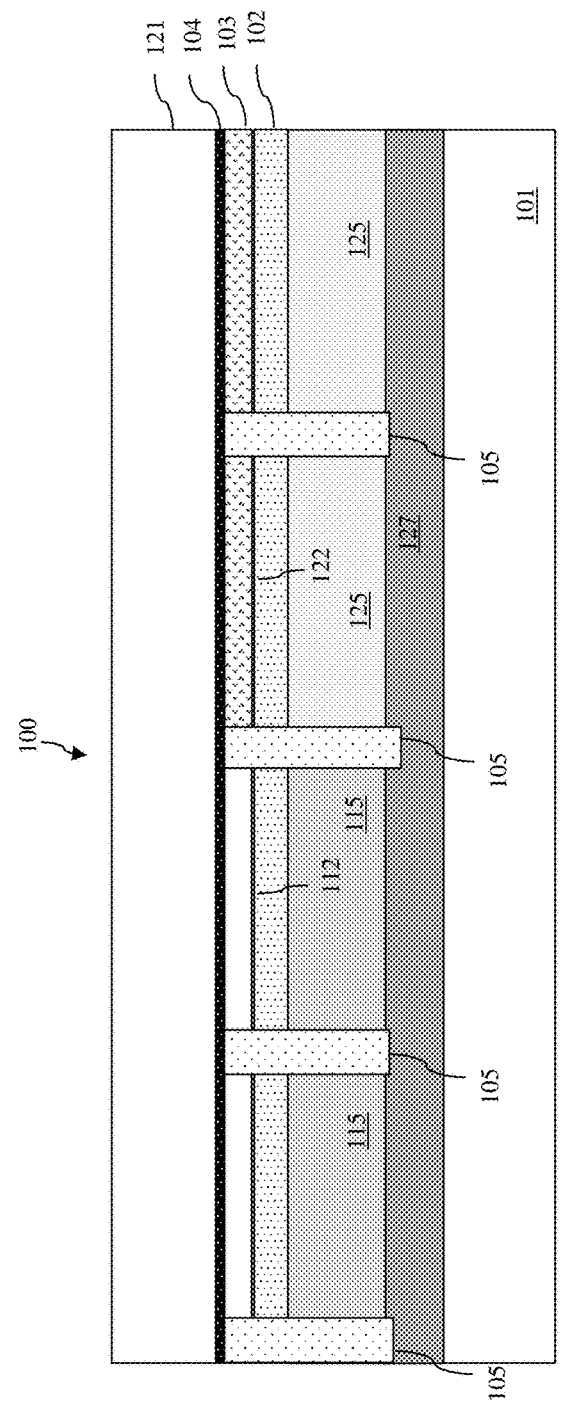

Thus, FIG. 2 illustrates that methods herein form one or more channel regions 112, 122 on a buried oxide layer 102. FIG. 3 illustrates that these methods form a gate dielectric 104 on the channel regions 112, 122. Further, these structures form a layer of conductive material (e.g., such as amorphous silicon with an overlaying silicon oxide layer) for the gate conductors 121 on the gate dielectric 104.

Figure 4:
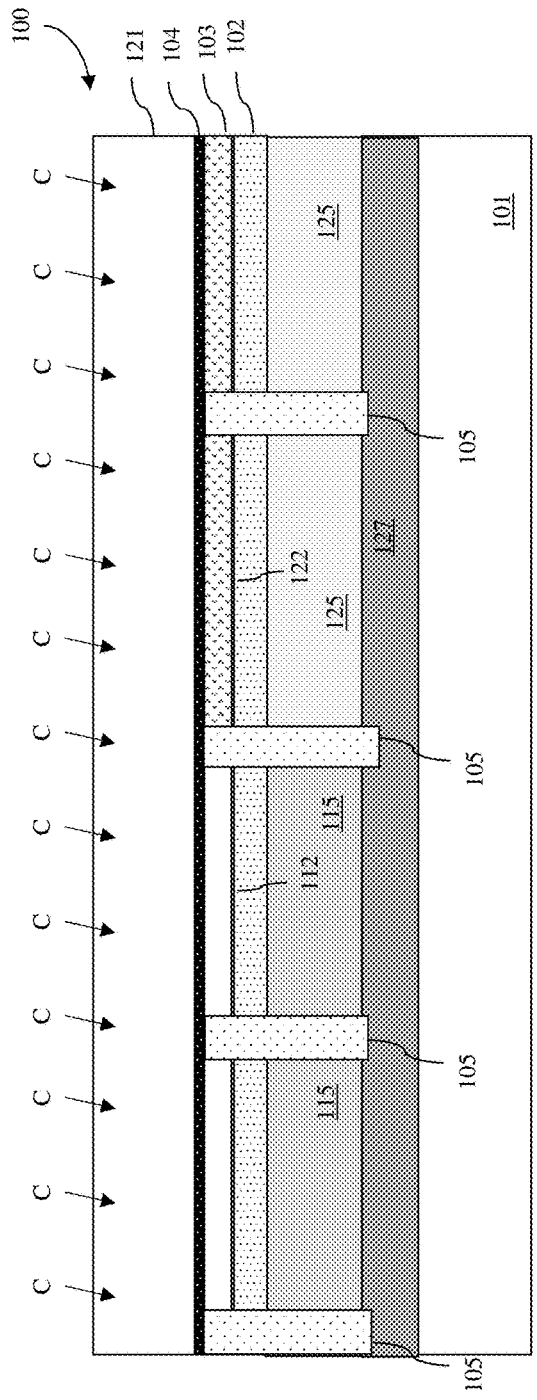

FIG. 4 illustrates that a silicide growth promoting-impurity, such as carbon ("C" with arrow), is implanted into the layer of conductive material for the gate conductors 121. In some examples, carbon can be implanted to form concentrations of carbon of approximately 1e15 in the gate conductors 111, 121, while there is generally no carbon or only trace amounts of carbon in the source and drain conductors, making the carbon concentrations in the gate conductors at least thousands of times higher than in the source and drain structures. Therefore, the methods herein provide an additional carbon (C) implantation after amorphous silicon 121 deposition, implantation & activation, and before any gate hardmask deposition.

Figure 5:
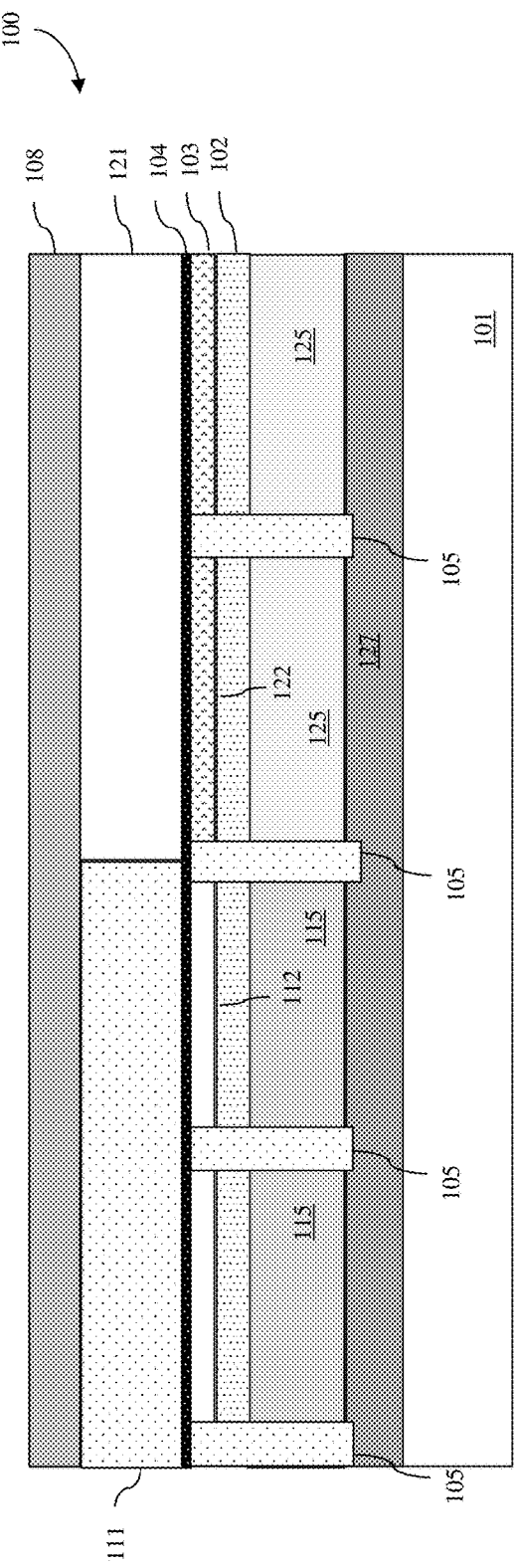
Figure 6:
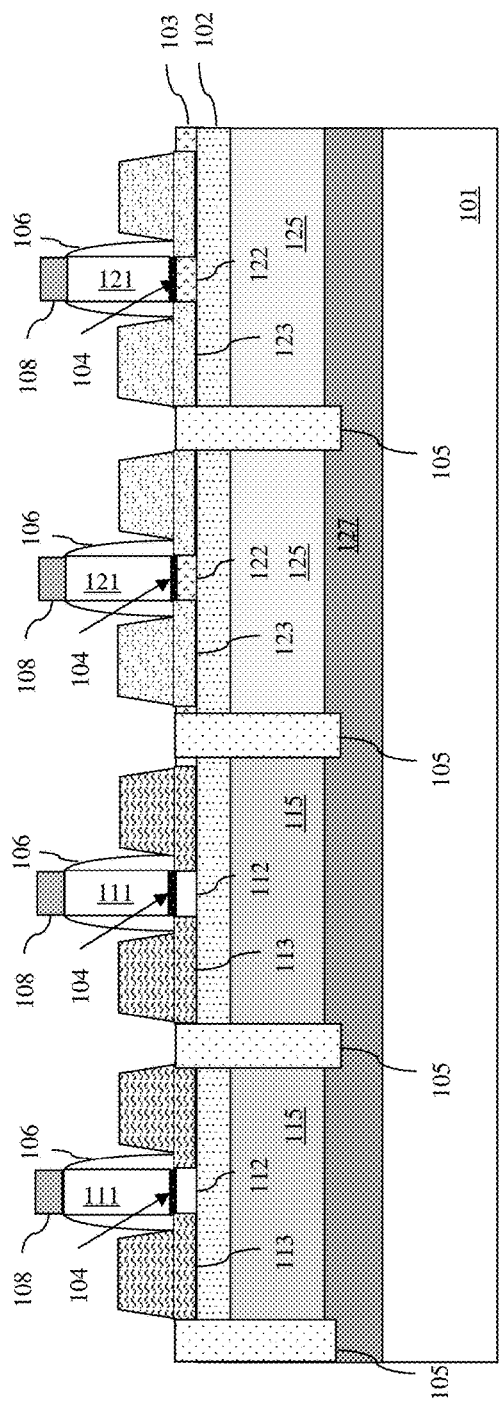

As noted above, some portions 111 of the conductive material 121 can be doped to adjust work function, and this is shown in FIG. 5. Additionally, FIG. 5 illustrates formation of the gate hardmask 108. FIG. 6 shows that the gate hardmask 108 is patterned, allowing the gate conductors 111, 121 to also be patterned. Thus, FIG. 6 shows that methods herein form a polysilicon structure 111,121 on the gate dielectric 104 when forming the gate conductor.

After the gate conductors 111, 121 are patterned, gate sidewall spacers 106 can be formed adjacent to the sidewalls of each gate conductor 111, 121. The gate sidewall spacers 106 can be formed, for example, using conventional gate sidewall spacer formation techniques. That is, a thin layer of dielectric gate sidewall spacer material (e.g., silicon dioxide, silicon oxynitride, silicon nitride or any other suitable dielectric gate sidewall spacer material) can be conformally deposited over the partially completed structure. Then, an anisotropic etch process can be performed in order to remove horizontal portions of the dielectric gate sidewall spacer material and leaving behind vertical portions (i.e., the gate sidewall spacers) positioned laterally adjacent to the sidewalls of the gate conductors.

FIG. 6 also shows that methods herein implant conductive impurities and grow additional conductive structures to form the raised source and drain structures 113, 123 on opposite sides of the channel region on the buried oxide layer and on opposite sides of the gate conductor 111, 121. More specifically, dopant implantation processes can be performed in order to form, in the semiconductor layer 103, the lower portions of the source and drain structures 113, 123 of each FET 110, 120. For the NFET 110, doping can be performed so that the portions of the source and drain structures 113 within the semiconductor layer 103 have N-type conductivity at the relatively high conductivity level. For PFET 120, doping can be performed so that the portions of the source and drain structures 123 within the semiconductor layer 103 have P-type conductivity at the relatively high conductivity level. It should be understood that any portions of the semiconductor layer that will have N+ conductivity (i.e., portions of the source and drain structures of the NFET) can be doped in the same dopant implantation process, while any portions of the semiconductor layer that will have P+ conductivity (i.e., portions of the source and drain structures of the PFET) are masked, and vice versa.

Next, in-situ doped epitaxial semiconductor layers (e.g., in-situ doped epitaxial silicon layers) can be formed on the semiconductor layer 103 in order to form upper portions of the source and drain structures 113, 123 of each FET 110, 120. Specifically, a mask can be formed over the partially completed structure and patterned with openings to areas designated for the source and drain structures 113 of the NFET 110. N+ epitaxial semiconductor layers (i.e., epitaxial semiconductor layers in-situ doped with an N-type dopant) can then be formed on the exposed portions of the semiconductor layer 103, thereby forming upper portions of the source and drain structures 113 of the NFET 110. The mask can be selectively removed. Additionally, a mask can be formed over the partially completed structure and patterned with openings to areas designated for the source and drain structures 123 of the PFET 120. P+ epitaxial semiconductor layers (i.e., epitaxial semiconductor layers in-situ doped with a P-type dopant) can then be formed on the exposed portions of the semiconductor layer 103, thereby forming upper portions of the source and drain structures 123 of the PFET 120. The mask can be selectively removed.

It should be noted that if the lower portions of source and drain structures 113, 123 within the semiconductor layer 103 were not doped, an anneal process can be performed in order to drive dopants from those upper portions (i.e., from the doped epitaxial semiconductor layers deposited) into semiconductor layer 103 below. This anneal process can be used to ensure that all portions of the source and drain structures 113, 123, including the lower portions of these features within the semiconductor layer 103, have the appropriate conductivity type and level.

Figure 7:
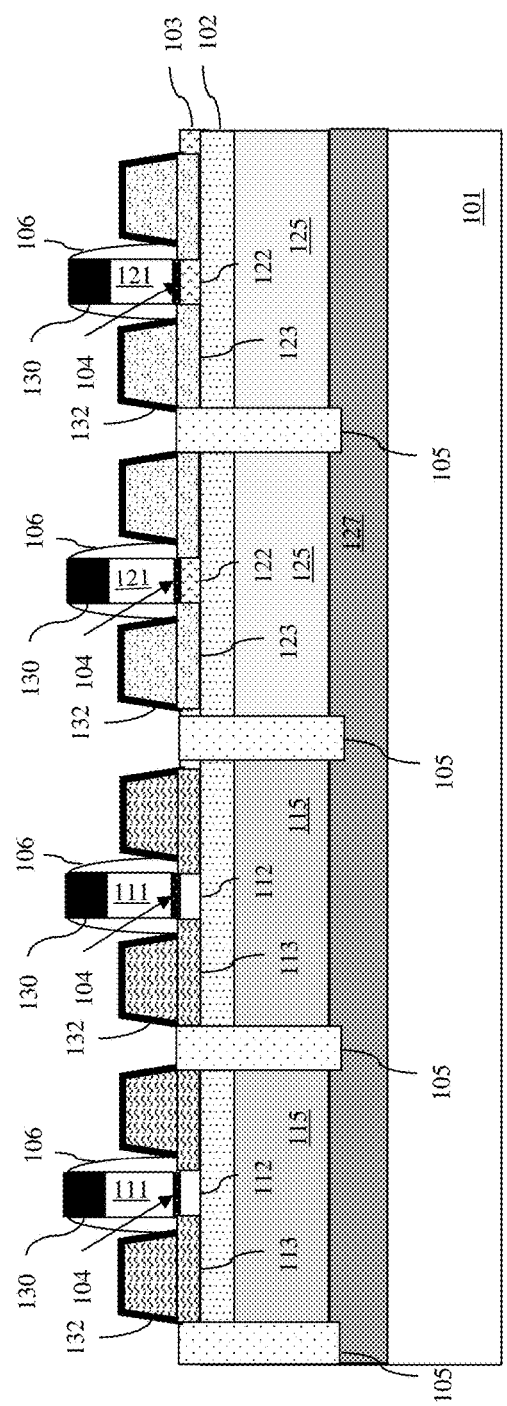

Additional processing can then be performed in order to complete the structures of the NFET 110 and the PFET 120. Specifically, FIG. 7 illustrates that methods herein form source and drain silicides 132 on the source and drain structures 113, 123 and a gate conductor silicide 130 on the gate conductor 111, 121. When forming a silicide, a metal layer is formed over silicon. An anneal is performed that causes the metal layer to react with the silicon to form a silicide layer, which affords high conductance. The silicide anneal is often performed at a comparatively lower temperature than the dopant activating anneal in order to limit undesirable metal diffusion.

The additional carbon (C) in the gate conductor 111, 121 will induce thicker silicide (e.g., NiSi) growth in the silicide processes. More specifically, such processes can simultaneously form the gate conductor silicide 130 and the source and drain silicides 132 (in a single process). This process can therefore grow the same metal silicide (e.g., nickel silicide) simultaneously on the gate conductor 111, 121 and the source and drain structures 113, 123. The carbon (C) implanted into the polysilicon structure 111, 121 causes the gate conductor silicide 130 to be formed thicker than the source and drain silicides 132. In some examples, the gate conductor silicide 130 is formed to be at least 5%-45% thicker than the source and drain silicides 132. The metal silicide layers can be, for example, layers of cobalt silicide (CoSi), nickel silicide (NiSi), tungsten silicide (WSi), titanium silicide (TiSi), or any other suitable metal silicide material.

Following the self-aligned silicide process, conventional middle-of-the-line (MOL) process can be performed. This MOL process can include, but is not limited to, deposition of one or more layers of dielectric material (see 136 in FIG. 1) over the partially completed structure and formation of contacts through the dielectric material to various device components. For each FET 110, 120, the MOL contacts can include primary contacts to primary terminals (i.e., to the source and drain structures 113, 123 and the gate conductor 111, 121) and, optionally, a secondary contact to a secondary terminal (i.e., to the well region 115, 125). As discussed above with regard to the structure embodiments, during FET operation, the secondary terminal can be selectively biased in addition to the primary terminals in order to modulate the threshold voltage (Vt) of the particular FET.

Figure 8:
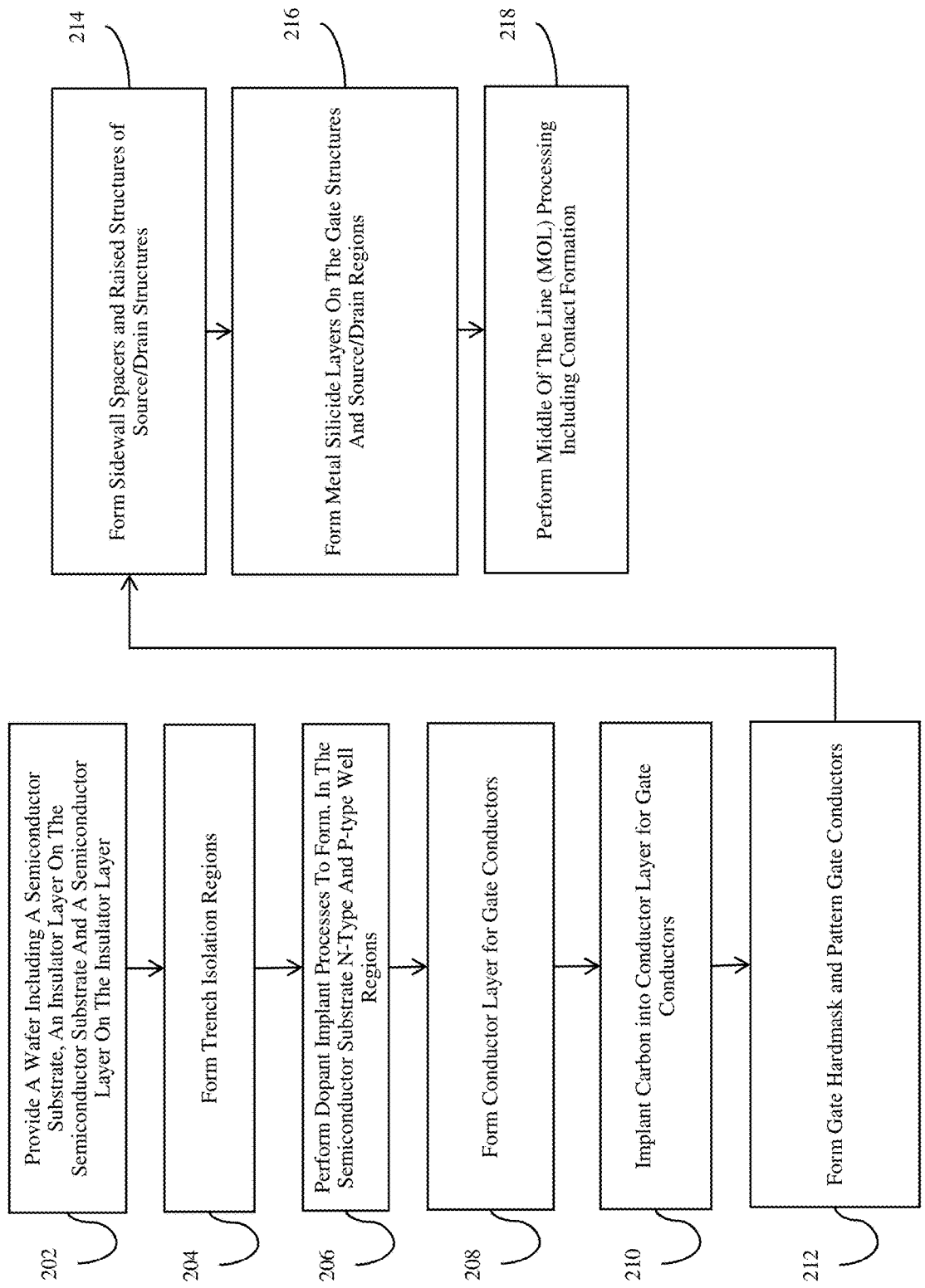
FIG. 8 is a flow diagram showing processing performed according to embodiments herein.

FIG. 8 is a flow diagram illustrating such methods herein. In item 202, these methods provide a wafer including a semiconductor substrate, an insulator layer on the semiconductor substrate and a semiconductor layer on the insulator layer. In item 204, these methods form trench isolation regions. As shown in item 206, such methods perform dopant implant processes to form, in the semiconductor substrate n-type and p-type well regions.

Item 208 shows that these methods form a conductor layer for the gate conductors. The methods implant carbon into this conductor layer for the gate conductors in item 210. Item 212 shows the formation of the gate hardmask and patterning of the gate conductors. In item 214, the sidewall spacers and raised structures of source and drain structures are formed.

Item 216 shows that these methods form source and drain silicides on the source and drain structures and a gate conductor silicide on the gate conductor. The additional carbon in the gate conductor will induce thicker silicide (e.g., NiSi) growth in the silicide processes. More specifically, such processes in item 216 can simultaneously form the gate conductor silicide and the source and drain silicides (in a single process). This process 216 can therefore grow the same metal silicide (e.g., nickel silicide) simultaneously on the gate conductor and the source and drain structures. The carbon implanted into the polysilicon structure in item 210 causes the gate conductor silicide to be formed thicker than the source and drain silicides. In some examples, the gate conductor silicide is formed to be at least 5%-45% thicker than the source and drain silicides. The metal silicide layers can be, for example, layers of cobalt silicide (CoSi), nickel silicide (NiSi), tungsten silicide (WSi), titanium silicide (TiSi), or any other suitable metal silicide material. In item 218 these methods perform middle of the line (MOL) processing including contact formation.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In the structures and methods described above a semiconductor refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a channel region;
    a gate dielectric on the channel region;
    source and drain structures on opposite sides of the channel region; and
    a gate conductor on the gate dielectric,
    wherein the source and drain structures include source and drain silicides, respectively,
    wherein the gate conductor includes a gate conductor silicide,
    wherein the gate conductor silicide is thicker than the source and drain silicides, and
    wherein the gate conductor has a higher carbon concentration than the source and drain structures.

2. The structure according to claim 1, wherein the gate conductor comprises any of an amorphous silicon and a polysilicon structure containing carbon between the gate conductor silicide and the gate dielectric.

3. The structure according to claim 1, wherein the gate conductor silicide and the source and drain silicides comprise the same metal silicide.

4. The structure according to claim 1, wherein the gate conductor silicide and the source and drain silicides comprise nickel silicide.

5. The structure according to claim 1, wherein a carbon concentration in the gate conductor is thousands of times higher than in the source and drain structures.

6. The structure according to claim 1, wherein the gate conductor silicide is at least 5%-45% thicker than the source and drain silicides.

7. The structure according to claim 1, further comprising a buried oxide layer, wherein the channel region and source and drain structures are on the buried oxide layer.

* * * * *